(12) United States Patent
Delfyett et al.

(10) Patent No.: US 6,671,298 B1
(45) Date of Patent: Dec. 30, 2003

(54) PHOTONIC ARBITRARY WAVEFORM GENERATION AND RF AND MICROWAVE SYNTHESIS WITH A MODELOCKED EXTERNAL CAVITY SEMI-CONDUCTOR LASER

(75) Inventors: Peter J. Delfyett, Geneva, FL (US); Tolga Yilmaz, Orlando, FL (US); Christopher M. Depriest, Winter Park, FL (US)

(73) Assignee: University of Central Florida, Orlando, FL (US)

( * ) Notice: Subject to any disclaimer, the term of this patent is extended or adjusted under 35 U.S.C. 154(b) by 0 days.

(21) Appl. No.: 10/443,492

(22) Filed: May 22, 2003

Related U.S. Application Data (60) Provisional application No. 60/382,406, filed on May 22, 2002.

(51) Int. Cl.[7] .................................................. H01S 3/10
(52) U.S. Cl. ............................ 372/26; 372/9; 372/31
(58) Field of Search ............................... 372/9, 26, 18, 372/98, 6, 31

(56) References Cited

U.S. PATENT DOCUMENTS

| | | | |
|---|---|---|---|
| 4,933,929 A | 6/1990 | Tajima | 370/3 |
| 5,373,382 A | 12/1994 | Pirio et al. | 359/161 |
| 5,379,309 A * | 1/1995 | Logan, Jr. | 372/18 |
| 6,014,237 A | 1/2000 | Abeles et al. | 359/124 |
| 6,172,782 B1 | 1/2001 | Kobayashi | 359/128 |
| 6,177,782 B1 | 1/2001 | L'Hermite et al. | 323/222 |
| 6,195,484 B1 * | 2/2001 | Brennan et al. | 385/37 |
| 6,388,782 B1 | 5/2002 | Stephens et al. | 359/124 |
| 6,411,408 B1 | 6/2002 | Dennis et al. | 359/124 |
| 2002/0067747 A1 * | 6/2002 | Jalali et al. | 372/9 |
| 2003/0147646 A1 * | 8/2003 | Zitelli | 398/65 |

* cited by examiner

Primary Examiner—Leon Scott, Jr.
(74) Attorney, Agent, or Firm—Brian S. Steinberger; Law Offices of Brian S. Steinberger, P.A.

(57) ABSTRACT

Photonic arbitrary waveform methods and generation by manipulating the phase-locked longitudinal modes of an approximately 12.4 GHz fundamentally modelocked external-cavity semiconductor laser are demonstrated. Photonically synthesized sine waves (center frequency of approximately 37.2 GHz, linewidth less than approximately 100 Hz, dynamic range approximately 50 dB at approximately 100 Hz resolution bandwidth) and complex, arbitrarily shaped optical/microwave frequency waveforms with instantaneous bandwidths up to approximately 75 GHz are shown. A WDM filter can be used to separate individual longitudinal modes of a modelocked laser. Photonic arbitrary generation occurs through the modulation of individual channels before recombining the channels, followed by amplifying the output.

9 Claims, 7 Drawing Sheets

PHOTONIC ARBITRARY WAVEFORM GENERATION AND RF AND MICROWAVE SYNTHESIS WITH A MODELOCKED EXTERNAL CAVITY SEMI-CONDUCTOR LASER

This invention claims the benefit of U.S. provisional application No. 60/382,406 filed May 22, 2002.

This invention relates to photonic waveform generation, in particular to a photonic arbitrary waveform generator (PAWG)/photonic microwave synthesizers and methods that can be used for a broad range of functions in optical analog and digital communications, direct detection and coherent detection architectures, and RF(radio frequency)/microwave applications, and this invention is funded in part under U.S. Department of Commerce Grant No. BS123456.

BACKGROUND AND PRIOR ART

Ultrahigh capacity optical information processing systems require a broad range of fimctionalities such as analog-to-digital conversion, digital-to-analog conversion, ultrahigh-speed optical sampling for next generation bit error rate measurement systems, and optical clock recovery. Conventional frequency synthesizers and arbitrary waveform generators have been proposed for these systems but generally can require many mixing steps to realize complex, high frequency microwave signals.

Various techniques are known for these systems, but fail to overcome all the problems with the prior art. See for example, U.S. Pat. Nos. 4,933,929 to Tajima; 5,373,382 to Pirio et al.; 5,379,309 to Logan, Jr.; 6,014,237 to Abeles et al.; 6,172,782 to Kobayashi; 6,177,782 to L'Hermite et al.; 6,195,484 to Brennan III et al.; 6,388,782 to Stephens et al.; 6,411,408 to Dennis et al.; and U.S. patent application publication U.S. 2002/0067747.

Thus, it would be desirable to overcome the deficiencies of the prior art.

SUMMARY OF THE INVENTION

The first objective of the present invention is to provide photonic arbitrary waveform generator (PAWG/photonic microwave synthesizers and methods for optical analog and digital communications.

The second objective of the present invention is to provide PAWG/photonic microwave synthesizers and methods that produce ultra short, ultra low jitter optical pulses for OTDM applications.

The third objective of the present invention is to provide PAWG/photonic microwave synthesizers and methods that produce coherent combs of phase-locked optical carriers for dense WDM applications.

The fourth objective of this invention is to provide PAWG/photonic microwave synthesizers and methods that produce low noise microwave clock signals.

The fifth objective of the present invention is to provide PAWG/photonic microwave synthesizers and methods that produce arbitrary intensity modulations on optical carriers with approximately 75 GHz of instantaneous bandwidth (limited by the WDM filter bandwidth), using low frequency drive signals.

The sixth objective of the present invention is to provide PAWG/photonic microwave synthesizers and methods for providing photonic arbitrary waveform generation through the modulation of individual channels before recombining.

Preferred embodiments of the invention demonstrate the operation of a PAWG/photonic microwave synthesizer that can use the longitudinal modes of an approximately 12.4 GHz fundamentally modelocked laser. Key attributes of the PAWG/photonic microwave synthesizer are that it can generate high quality microwave signals in a single mixing step in contrast to conventional frequency synthesizers and arbitrary waveform generators which may require many mixing steps to realize complex, microwave signals. In the PAWG/photonic microwave synthesizer demonstrated here, a channel-to-channel stability of less than 100 Hz is obtained on an approximately 37.2 GHz optically induced microwave tone, while simultaneously generating a variety of arbitrarily shaped microwave waveforms by intensity modulation of the phase locked WDM channels. The WDM filter can be used to separate the individual longitudinal modes(as many as filter channels) of a modelocked laser.

Further objects and advantages of this invention will be apparent from the following detailed description of the presently preferred embodiments which are illustrated schematically in the accompanying drawings.

DESCRIPTION OF THE PREFERRED EMBODIMENTS

Before explaining the disclosed embodiments of the present invention in detail it is to be understood that the invention is not limited in its application to the detail, of the particular arrangements shown since the invention is capable of other embodiments. Also, the terminology used herein is for the purpose of description and not of limitation.

The PAWG/photonic microwave synthesizer can be used for a broad range of functions in optical analog and digital communications, direct detection and coherent detection architectures, and RF/microwave applications. B. Jalali, P. Kelkar, V. Saxena, "Photonic arbitrary waveform generator," in 2001 *IEEE/LEOS Annual Meeting Conference Proceedings,* 2001, pp. 253–254; R. Logan, "Uniphase RF photonics capabilities," in *DARPA/ETO Workshop on R-FLICS*, 1999; and A. J. Seeds, "Microwave photonics," *IEEE Trans. Microwave Theory Tech.* vol. 50, pp. 877–887, 2002.

Photonic arbitrary waveform generation relies on the fact that modelocked lasers produce a periodic comb of phase-locked longitudinal modes. These phase-locked optical carriers serve as a basis set to produce an arbitrary modulation impressed on an optical signal. Arbitrary waveforms are then synthesized by controlling the amplitudes and phases of the individual longitudinal modes.

I. Setup

Figure 1:
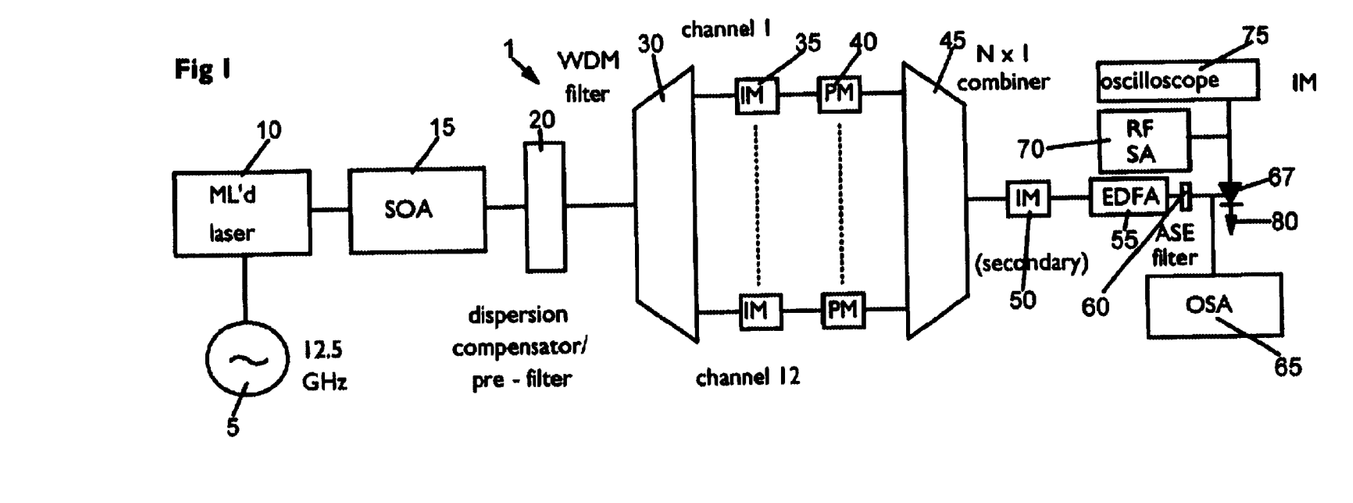
FIG. 1 shows the general schematic for the novel PAWG/photonic microwave synthesizer.

FIG. 1 shows the general schematic for the PAWG/photonic microwave synthesizer. A photonic arbitrary waveform generator/photonic RF synthesizer general setup can include an approximately 12.5 GHz source 5, a modelocked laser 10, SOA(semiconductor optical amplifier) 15, dispersion compensator/pre-filter 20, WDM(waveform demultiplexing filter) 30, and separate channels(1–12 shown) that each can include an IM(intensity modulator) 35, PM(phase modulator) 40, N×1 Combiner 45, secondary IM(intensity modulator) 50, EDFA 55, ASE: amplified spontaneous emission)filter 60, which feeds to an OSA(optical spectrum analyzer) 65, and RF SA(RF spectrum analyzer) 70, oscilloscope 75 and output 80.

The laser source 5, 10 can be an external-cavity semiconductor laser hybridly modelocked at approximately 12.4/12.5 GHz, emitting pulses at approximately 1550 nm.

Figure 2:
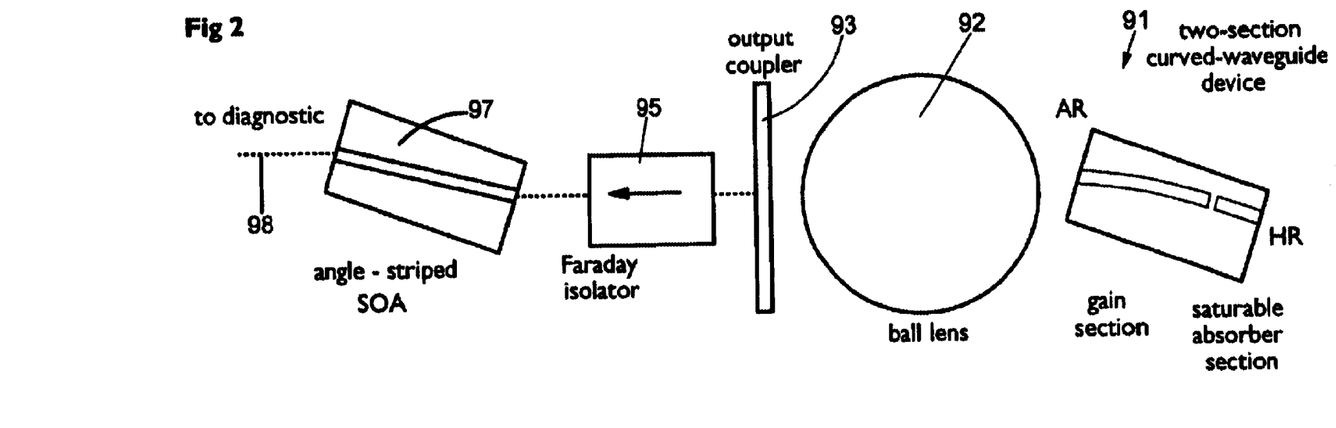
FIG. 2 shows the schematic of the linear external-cavity laser where the gain medium is a two-section curved-waveguide semiconductor device.

FIG. 2 shows the schematic of the linear external-cavity laser where the gain medium is a 1.5 mm long, two-section curved-waveguide semiconductor device 91 having an approximately 50 µm SA section that can operate at an approximately 1550 nm wavelength. The cavity length is adjusted to the fundamental cavity frequency of approximately 12.4 GHz. The facet on the SA section side can be a high-reflector(HR) facet and the other facet can have an anti-reflection coating. An external-cavity can be formed by the HR-coated facet and an approximately 90% reflective output coupler placed on the AR-coated facet side. A 3 mm diameter ball lens 92 collimates the light onto the output coupler 93. The gain section of the device 91 is biased at approximately 65 mA. Hybrid modelocking can be achieved by applying an approximately 5 to approximately 6 V of reverse voltage and a microwave signal on the SA section. When the SA section is unbiased, the lasing threshold is measured to be approximately 30 mA. The laser cavity length can be adjusted to correspond to fundamental cavity frequencies of up to approximately 14 GHz by translating the output coupler 94. A 2.3 mm long angle-striped SOA (semi-conductor optical amplifier) 97 connected to a Faraday isolator 95 amplifies the approximately 1 mW of output power from the modelocked laser to approximately 20 mW to diagnostics/output 98. Noise characteristics of the laser have been described in both T. Yilmaz, C. M. DePriest, and P. J. Delfyett, Jr., "Complete noise characterization of an external cavity semiconductor laser hybridly modelocked at 10 GHz," *Electron. Lett.*, vol. 37, pp. 1338–1339, 2001; and T. Yilmaz, C. M. DePriest, A. Braun, J. Abeles, and P. J. Delfyett, Jr., "Residual phase noise and longitudinal mode linewidth measurements of hybridly modelocked external linear cavity semiconductor laser," *Optics Lett.*, vol. 27, 872–874, 2002.

Referring to FIG. 1, a 12-channel WDM filter 30, such as but not limited to an Essex Corp. Hyperfine WDM, with channel spacing of approximately 6.2 GHz can be used to separate modelocked laser longitudinal modes. The channel width can be approximately 5 GHz. Every other filter channel (approximately 12.4 GHz spacing) can be used to lower the crosstalk between adjacent filtered modes. The WDM filter 30 can have a foldover period of approximately 75 GHz, i.e. for a broadband spontaneous emission input, each channel gives an output spectrum periodic at approximately 75 GHz. In order to eliminate the foldover and to select a single longitudinal mode in each channel, a dual-grating dispersion compensator having approximately 10 dB insertion loss is used as a pre-filter. See C. M. DePriest, A. Braun, J. H. Abeles, and P. J. Delfyett, Jr., "10-GHz ultralow noise optical sampling stream from a semiconductor diode ring laser," *IEEE Photonics Technol. Lett.*, vol. 13, pp. 1109–1111, 2001; and E. B. Treacy, "Optical pulse compression with diffraction gratings," *IEEE J. Quantum Electron.*, vol. QE-5, 454, 1969. A slit placed in the Fourier plane of the dispersion compensator 20 can act as a hard-edge filter with an approximately −3-dB bandwidth of approximately 30 GHz. Each WDM filter channel(1–12) can be sent through electro-optic intensity modulators(IM) 35, such as but not limited to SDL IOAP-MOD9170-F-F-0 model having an approximately 20 GHz bandwidth, and phase modulators(PM) 40, such as but not limited to Microphotonics Integration 12005 model having an approximately 10 GHz bandwidth, to control the relative intensity and phase between the channels. The independently modulated channels can be combined by an N×1 combiner 45, taking care to match the polarization state of each channel. The combined channels can be directed through a secondary intensity modulation stage 50 for additional modulation.

The modulated and combined channels can be amplified 55 and directed to diagnostics comprised of a, optical spectrum analyzer 65, such as but not limited to a high resolution Ando AQ6317B model. having approximately 0.01 nm resolution, an approximate 40 GHz photodetector 67, such as but not limited to a New Focus 1011 model, followed by approximate 50 GHz microwave spectrum analyzer 70, such as but not limited to a HP 8565E model, and an approximately 50 GHz sampling oscilloscope 75, such as but not limited to a Tektronix CSA 803 model.

II. Experimental Results

Figure 3:
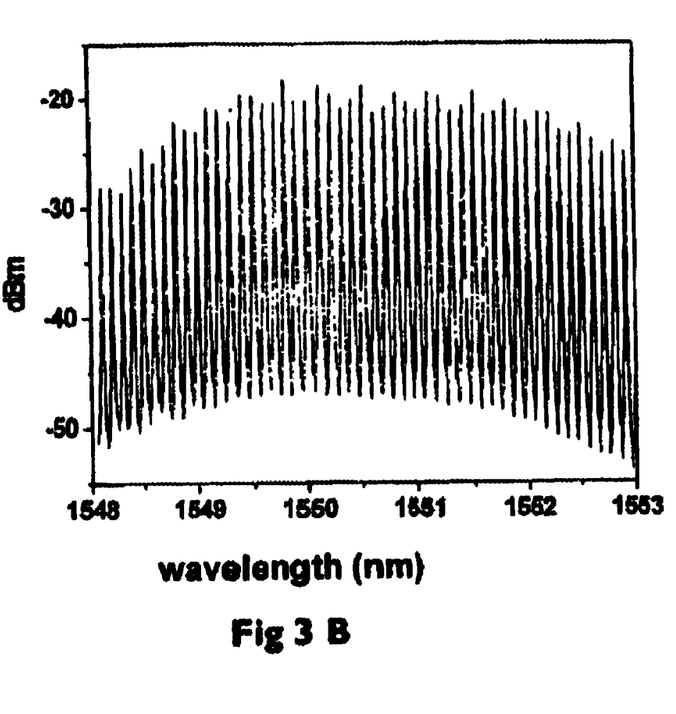
FIG. 3a displays the approximately 12.4 GHz fundamentally modelocked laser pulse autocorrelation traces obtained before and after dispersion compensation.
FIG. 3b shows the optical spectrum of the 12.4 GHz modelocked laser.

FIG. 3a displays the 12.4 GHz fundamentally modelocked laser pulse autocorrelation traces (measured with a Femtochrome Research FR-103XL model autocorrelator) obtained before and after dispersion compensation, and FIG. 3b displays the optical spectrum. The modulation on the spectrum is due to the residual facet reflectivity of the semiconductor optical amplifier (SOA) 15 following the laser 10 shown in FIG. 1. The SOA 15, which was manufactured by Sarnoff Corporation, was approximately 2.3 mm in length with a saturation power of approximately 13 dBm at approximately 150 mA of bias current. The pulses from the laser are compressed from approximately 11.5 to approximately 1.5 ps (both deconvolved FWHM values assuming Gaussian shaped pulses) using the dual-grating dispersion compensator/pre-filter. The optical spectrum shows a longitudinal mode spacing of approximately 12.4 GHz with approximately 35 phase-locked longitudinal modes in an approximately −3-dB bandwidth.

Figure 4:
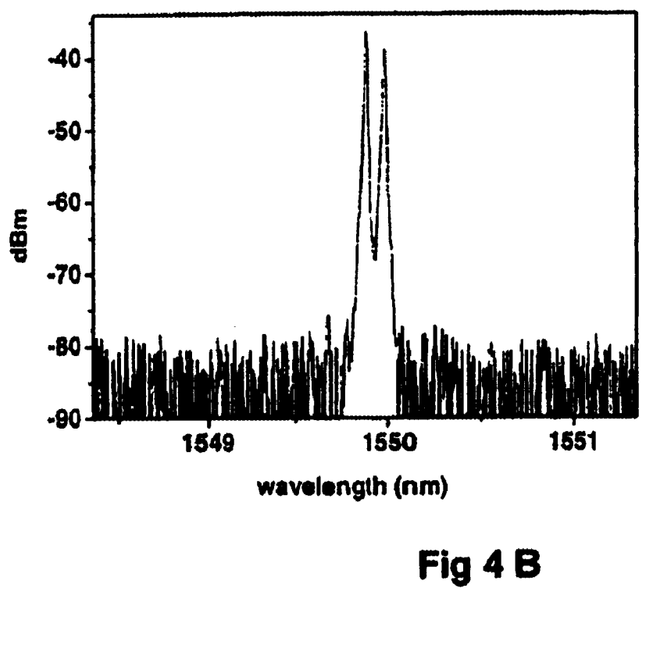
FIG. 4a shows the optical spectra of single-channel of the WDM filter.
FIG. 4b shows the approximately 12.4 GHz-spaced two-channel outputs of the WDM filter.

FIGS. 4a and 4b show the optical spectra of single-channel and approximately 12.4 GHz-spaced two-channel outputs of the WDM filter. The single-channel output in FIG. 4a, has an approximately 39 dB optical signal-to-noise-ratio (SNR) limited by the leakage of adjacent longitudinal modes that could not be filtered out by the dispersion compensator/pre-filter. The approximately −3-dB line widths of the longitudinal modes were measured to be about approximately 50 MHz. See also, T. Yilmaz, C. M. DePriest, A. Braun, J.

Abeles, and P. J. Delfyett, Jr., "Residual phase noise and longitudinal mode linewidth measurements of hybridly modelocked external linear cavity semiconductor laser," *Optics Lett.,* vol. 27, 872–874, 2002.

Figure 5:
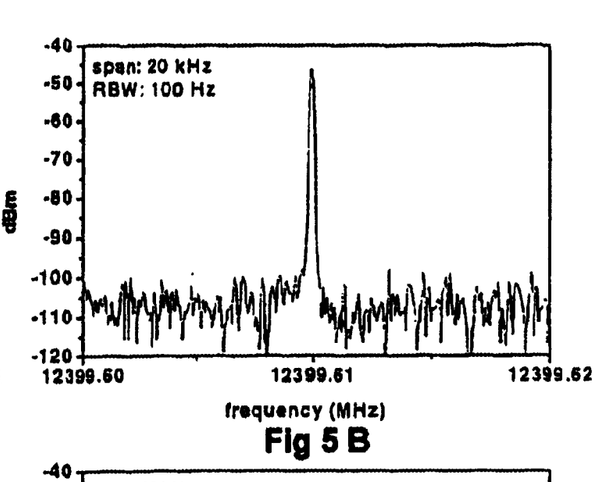
FIGS. 5a, 5b, 5c and 5d displays the microwave spectra showing the performance of the PAWG working as a photonic microwave synthesizer.

FIGS. 5a, 5b, 5c, and 5d displays the microwave spectra showing the performance of the PAWG working as a photonic microwave synthesizer. Two longitudinal modes are selected using the WDM filter 30(shown in FIG. 1). The two channels were recombined by a 2×1 combiner 45, amplified with an erbium-doped fiber amplifier (EDFA) 55, (here a Synchronous Communications, Inc. Fiber Optic Link Optical Amplifier) of approximately 16 dBm saturation power, detected using an approximately 40 GHz photodetector 67, and subsequently analyzed with a. microwave spectrum analyzer 70. In FIGS. 5b, 5c and 5b, the detected microwave beat notes when the selected two modes have spacings of approximately 12.4, 24.8, and 37.2 GHz, respectively. The salient feature of these photonically synthesized beat notes is their high spectral purity (linewidth<100 Hz resolution bandwidth). The phase noise on the phase-locked longitudinal modes is correlated and therefore the electrical beat signal has the linewidth of the modelocking microwave synthesizer. For comparison, a microwave spectrum of the modelocking signal (at approximately 12.4 GHz) from the microwave synthesizer (HP 83712B) is shown in FIG. 5a, which clearly demonstrates that there is negligible difference in noise performance between the approximately 12.4 GHz modelocking signal and the approximately 12.4, 24.8, and 37.2 GHz photonically synthesized signals. This demonstration shows the potential of generating ultrahigh quality, high frequency photonically synthesized microwave tones in a single optical mixing step, as compared to the multiple mixing step approach in conventional microwave synthesizers.

Figure 6:
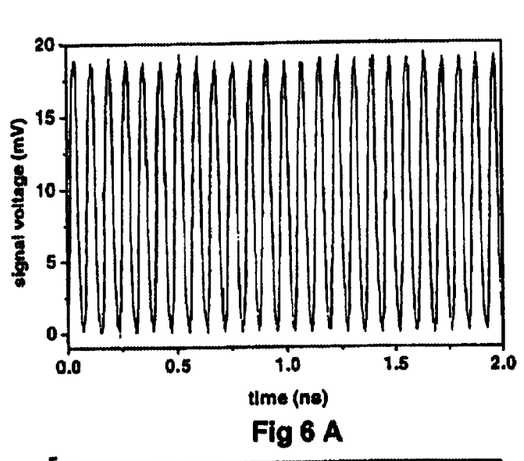
FIGS. 6a, 6b, 6c, and 6d shows high speed sampling oscilloscope waveforms, demonstrating the functionality of the PAWG operating with two channels selected approximately 12.4 GHz apart.

FIGS. 6a, 6b, 6c and 6d show high speed sampling oscilloscope waveforms, demonstrating the functionality of the PAWG operating with two channels selected approximately 12.4 GHz apart. For these experiments, a second EDFA is inserted after the dispersion compensator/pre-filter to compensate the loss due to the secondary intensity modulator. FIG. 6a is the time domain oscilloscope trace of an optically generated approximately 12.4 GHz beat tone, corresponding to the operation of the photonic microwave synthesizer with the optical spectrum shown in FIG. 4b. FIG. 6b shows the temporal output of the PAWG when a comb generator (here a HP 33004A model, resonance frequency 500 MHz) driven off-resonance at approximately 620 MHz is used to impart a complex waveform to the secondary intensity modulator. The resulting output shows the approximately 12.4 GHz beat frequency, with the time domain signature of the comb generator impressed on the approximately 12.4 GHz beat note. FIG. 6c shows the temporal PAWG output when an approximately 620 MHz sinusoidal modulation is applied to the secondary intensity modulator. The modulator is biased at phase quadrature, allowing it to operate within the linear portion of the transmission-voltage transfer function. FIG. 6d shows the temporal PAWG output with the secondary intensity modulator DC bias set to operate around the transmission minimum. In this case, the applied approximately 620 MHz modulation is converted to an approximately 1.24 GHz intensity modulation of the approximately 12.4 GHz beat frequency. The sampling oscilloscope is triggered at the modulation frequency in each case.

FIGS. 6c and 6d also show the modulated EDFA amplified spontaneous emission (ASE) when the laser input to the WDM filter 30 is blocked. The presence of ASE 60 from the EDFA 55 limits the SNR of the modulated sine wave. From the experiments, the saturation power of the available EDFA (16 dBm) after the pre-filter 20 is not high enough to overcome the SNR degradation due to the combined modulator and WDM filter 30 insertion losses (approximately 5 and approximately 11 dB per channel, respectively). For this reason, modulators before the N×1 combiner 45 are not used and the potential for architecture is demonstrated using only two WDM filter channels photonic arbitrary waveform generation with the proposed. No effort is made to reduce the optical frequency comb drift of the modelocked laser relative to the WDM filter frequency grid. Frequency match of the laser and the filter is observed for durations of the order of a minute. Laser frequency stabilization techniques such as Pound-Drever-Hall locking can be employed for long term stability. See R. W. P. Drever, J. L. Hall, F. V. Kowalski, J. Hough, and G. M. Ford. A. J. Munley, H. Ward, "Laser phase and frequency stabilization using an optical resonator", *Appl. Phys. B.,* vol. 31, 97–105, 1986.

Figure 7:
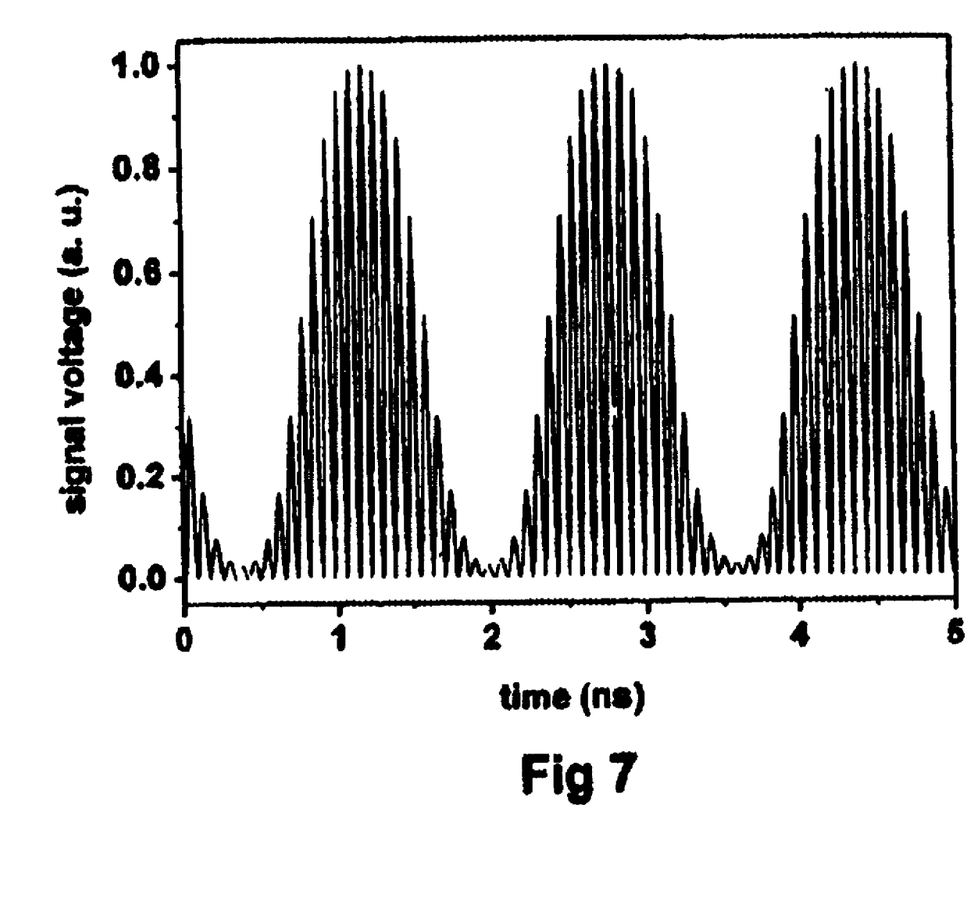
FIG. 7 shows the calculated time domain of the approximately 12.4 GHz beat signal corresponding to the data in FIG. 6c.

FIG. 7 displays the calculated time domain approximate 12.4 GHz beat signal corresponding to the data in FIG. 6c. The signal contrast is better due to the absence of any background spontaneous emission noise.

A chirped microwave signal can be used in applications such as the imaging radar. In order to demonstrate a sinusoidal chirp with the PAWG, better SNR in the signal after the WDM filter 30 is necessary, an IPG Photonics EAD-500-C model EDFA having 0.5 W saturation output can be used. Referring to FIGS. 1, 2, the modelocked laser output can be amplified to approximately 10 mW with a 2.3 mm angle-stripe SOA, followed by the 0.5 W EDFA. The output from the EDFA can be pre-filtered with a Southampton Photonics BN01-0005 model fiber Bragg grating (FBG) filter having a center wavelength of 1550.5 nm and an insertion loss of 4.3 dB. The FBG filter has a −3-dB width of 25 GHz. The optical power is −13 dBm per longitudinal mode after the SOA and 5 dBm per mode after the FBG filter. Output from the FBG filter is amplified by an EDFA having 16 dBm saturation output power, giving 11.1 dBm of power per mode. Finally, modes are spatially separated into fibers using the WDM filter with 2.1 dBm power per mode.

Two channels can be separated by 12.5 GHz are selected with the WDM filter and one channel is sinusoidally phase modulated at 2.5 GHz while the other channel has no modulation imposed on it. The two channels are combined with a 3-dB fiber coupler and heterodyne mixed in a photodetector, such as but not limited to a Discovery Semiconductor DSC40S model, having a bandwidth of 14 GHz, making sure that the optical path lengths of the two channels are as close as possible after the WDM filter to preserve their coherence.

Figure 8:
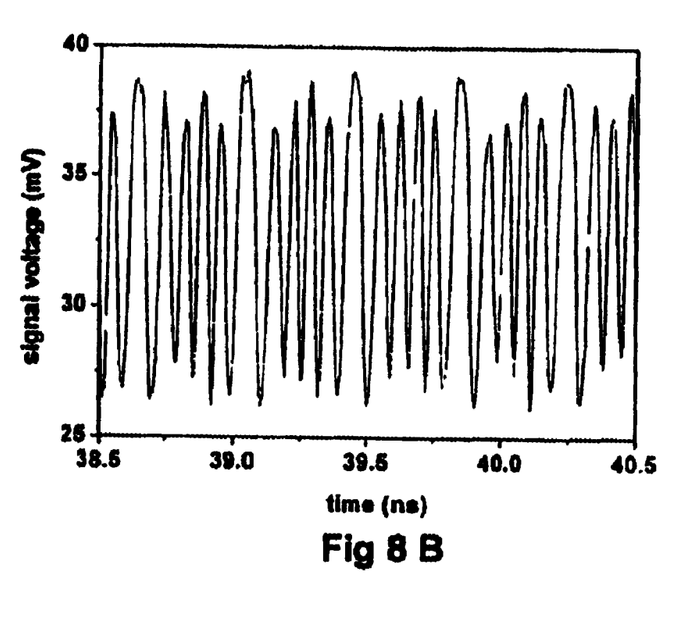
FIGS. 8a and 8b shows the calculated and experimentally obtained 12.5 GHz time domain beat signals with a periodic chirp at 2.5 GHz.

FIGS. 8a and 8b shows the calculated(FIG. 8a) and experimentally obtained(FIG. 8b) time domain beat signals. The experimental trace is averaged 32 times by the sampling oscilloscope. There is a sinusoidal chirp at the phase modulation frequency of 2.5 GHz. The instantaneous frequency sweeps between 8 and 17 GHz, covering an octave. The amplitude modulation on the experimentally obtained trace is due to the parts of the trace where the instantaneous frequency exceeds the bandwidth of the 14 GHz photodetector.

In addition to a sinusoidal chirp, linear chirp can be obtained by keeping one channel unmodulated while modulating the second channel with a quadratic waveform, for example, obtained from an electrical arbitrary waveform generator. The modulated channel will have a linear frequency change and the beat between the two channels will show a linear chirp. Another demonstration may be performed by applying a ramp PM on one channel resulting in a constant frequency change and the beat note will be shifted in frequency.

The invention has applicability to ultrahigh capacity optical information processing systems that require a.broad range of functionalities, such as but not limited to analog-to-digital conversion, digital-to-analog conversion, ultrahigh-speed optical sampling for next generation bit error rate measurement systems, optical clock recovery systems, and the like.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method of generating photonic arbitrary waveforms, comprising the steps of:
   producing a periodic comb of phase-locked longitudinal modes from a modelocked laser source;
   separating the longitudinal modes into discrete longitudinal modes which function as plural channels with a WDM filter;
   independently intensity and phase modulating each of the channels before recombining the channels to form photonic arbitrary waveforms; and
   recombining each of the intensity and phase modulated channels to form modulated and combined channels.

2. The method of claim 1, further comprising the step of:
   intensity modulating the modulated and combined channels to form secondary intensity modulation of the channels.

3. The method of claim 1, further comprising the step of:
   amplifying the modulated and combined channels with an amplifier to form an output.

4. The method of claim 3, wherein the amplifying step further includes the step of:
   providing an erbium-doped fiber amplifier(EDFA) as the amplifier.

5. A photonic arbitrary waveform generator (PAWG), comprising:
   a modelocked laser source for producing a periodic comb of phase-locked longitudinal modes;
   a WDM filter for selecting discrete longitudinal modes which function as plural channels;
   means for independently modulating intensity and phase of each of the channels before recombining the channels to form photonic arbitrary waveforms; and
   means for recombining each of the intensity and phase modulated channels to form modulated and combined channels.

6. The generator of claim 5, wherein the recombining means includes:
   a Nx1 combiner.

7. The generator of claim 5, further comprising:
   an amplifier for amplifying the modulated and combined channels.

8. The generator of claim 7, wherein the amplifier includes:
   an EDFA(erbium-doped fiber amplifier) amplifier.

9. The generator of claim 5, further comprising:
   an additional intensity modulator for modulating the modulated and combined channels.

* * * * *

UNITED STATES PATENT AND TRADEMARK OFFICE
CERTIFICATE OF CORRECTION

PATENT NO. : 6,671,298 B1
DATED : December 30, 2003
INVENTOR(S) : Peter J. Delfyett, Tolga Yilma z and Christopher M. Depriest It is certified that error appears in the above-identified patent and that said Letters Patent is hereby corrected as shown below:

Column 1,
Lines 9-16 should be changed to read:
  This invention relates to photonic waveform generation, in particular to a photonic arbitrary waveform generator (PAWG)/photonic microwave synthesizers and methods that can be used for a broad range of functions in optical analog and digital communications, direct detection and coherent detection architectures, and RF (radio frequency)/ microwave applications, and this invention is funded in part under U.S. Department of Commerce Grant No. BS123456 and this invention was made with Government support under Contract F30602-99-1-0546 awarded by the Air Force. The Government has certain rights in this invention.

Signed and Sealed this

Thirteenth Day of July, 2004

JON W. DUDAS
*Acting Director of the United States Patent and Trademark Office*